United States Patent
Kuchenhart

[19]

[11] Patent Number: 5,769,304
[45] Date of Patent: Jun. 23, 1998

[54] SMD SOLDERING APPARATUS

[75] Inventor: Friedrich-Wilhelm Kuchenhart, Dusseldorf, Germany

[73] Assignee: Fredart Sondermaschinen GmbH, Dusseldorf, Germany

[21] Appl. No.: 530,137

[22] PCT Filed: Mar. 17, 1994

[86] PCT No.: PCT/EP94/00844

§ 371 Date: Aug. 13, 1996

§ 102(e) Date: Aug. 13, 1996

[87] PCT Pub. No.: WO94/21415

PCT Pub. Date: Sep. 29, 1994

[30] Foreign Application Priority Data

Mar. 19, 1993 [DE] Germany ............................ 9304076 U

[51] Int. Cl.⁶ ............................ B23K 3/047; B23K 1/008
[52] U.S. Cl. ................................. 228/9; 228/59; 219/388; 219/405; 219/35.12

[58] Field of Search .................................... 228/102–105, 228/180.21, 180.22, 8, 9, 56.5; 219/388, 390, 405, 441, 85.12; 432/226

[56] References Cited

FOREIGN PATENT DOCUMENTS 0 209 650  1/1987  European Pat. Off. .
  967701 10/1982  U.S.S.R. .

*Primary Examiner*—Samuel M. Heinrich
*Attorney, Agent, or Firm*—Steven F. Caserza; Flehr Hohbach Test Albritton & Herbert

[57] ABSTRACT

In the attachment of surface mounted devices, melting of solder is monitored so that immediately thereafter heating may be stopped. The solder paste, which is stump-grey below the melting point, will radically change its reflectance upon melting, this being detectable by means of a video camera.

5 Claims, 4 Drawing Sheets

SMD SOLDERING APPARATUS

BACKGROUND

The invention relates to a Surface Mounted Device (SMD) soldering apparatus. For mounting the components on the upside wiring the so-called reflow soldering is used. The soldering spots are provided with solder paste—preferably by means of respective handling apparatuses—, and the board is provided with the components, preferably also by means of handling apparatuses. Thereafter the component-carrying circuit board (hereinafter "board") is heated, preferably by heat radiation, up to the soldering temperature. The heating is usually implemented in three temperature steps. In a first step, heating up to about 100° C. in order to remove solvents in the solder paste. In a second step, the board is heated to a temperature little below the solder melting temperature in an attempt to bring the entire board to substantially uniform temperature. In a third step, the solder is molten.

Known SMD reflow soldering installations are designed as tunnel furnaces through which the boards are continuously conveyed.

The known installations have some weaknesses.

Some SMD components, in particular semiconductor circuits, are conceived such that they support the melting temperature of the solder over a short time interval. Consequently, the third temperature step should be as short as possible. On the other hand, however, melting of all solder spots must be assured. With the known installations, several trials will have to be executed for a certain type of circuit in order to adjust the parameters properly. Nevertheless, the number of rejects is high, and repairs, if at all possible, require considerable effort.

It is a matter of course that such conveyer soldering installations are conceived for mass production because the high trial and reject rate would not be economically feasible for production of individual boards or a small series of boards.

A third drawback of the known installations is their conceptual basis to heat the entire board as uniformly as possible up to the melting point of the solder. This forces the designer to distribute the components in a similarly uniform pattern on the board surface regardless of their functional interaction and with a resulting disadvantageous wiring.

SUMMARY

It is the object of the present invention to eliminate or at least to reduce at least some of the drawbacks of the prior art mentioned above.

According to a first aspect, the invention provides not to determine the soldering parameters (temperature-time-control) by trial and error but that the very melting of the solder is monitored so that immediately thereafter heating may be stopped. To do so, preferably the phenomenon is utilized that the solder paste which is stump-grey below the melting point will radically change its reflectance upon melting, this being detectable by means of, for example a video camera.

This also removes the obstacle for utilizing SMD technique with individual boards or small series of boards so that instead of a conveyer furnace an apparatus may be used for single boards. In this apparatus, the three temperature-time-processes are successively implemented. In accordance with a further aspect of the invention, however, such apparatus may be modified for larger series in that it is preceded by a tunnel conveyer furnace wherein the first two heating steps are implemented while the supplemented apparatus will implement only the last, terminating step. It will be understood that the conveying will then not be continuous but occur in steps.

The fact that the board during soldering is stationary will facilitate application of a third aspect of the present invention. According thereto, a device is provided which permits to mask select areas of a board over selected time intervals so that other areas having higher heat absorption (e.g. heat sinks) are heated over a longer time period. In this way, the designer is free from the restrictions mentioned above.

A preferred embodiment of the invention will be explained hereunder with reference to the accompanying drawings. The illustrations are schematic to a large extent in order to show essential details.

DETAILED DESCRIPTION

Figure 1:
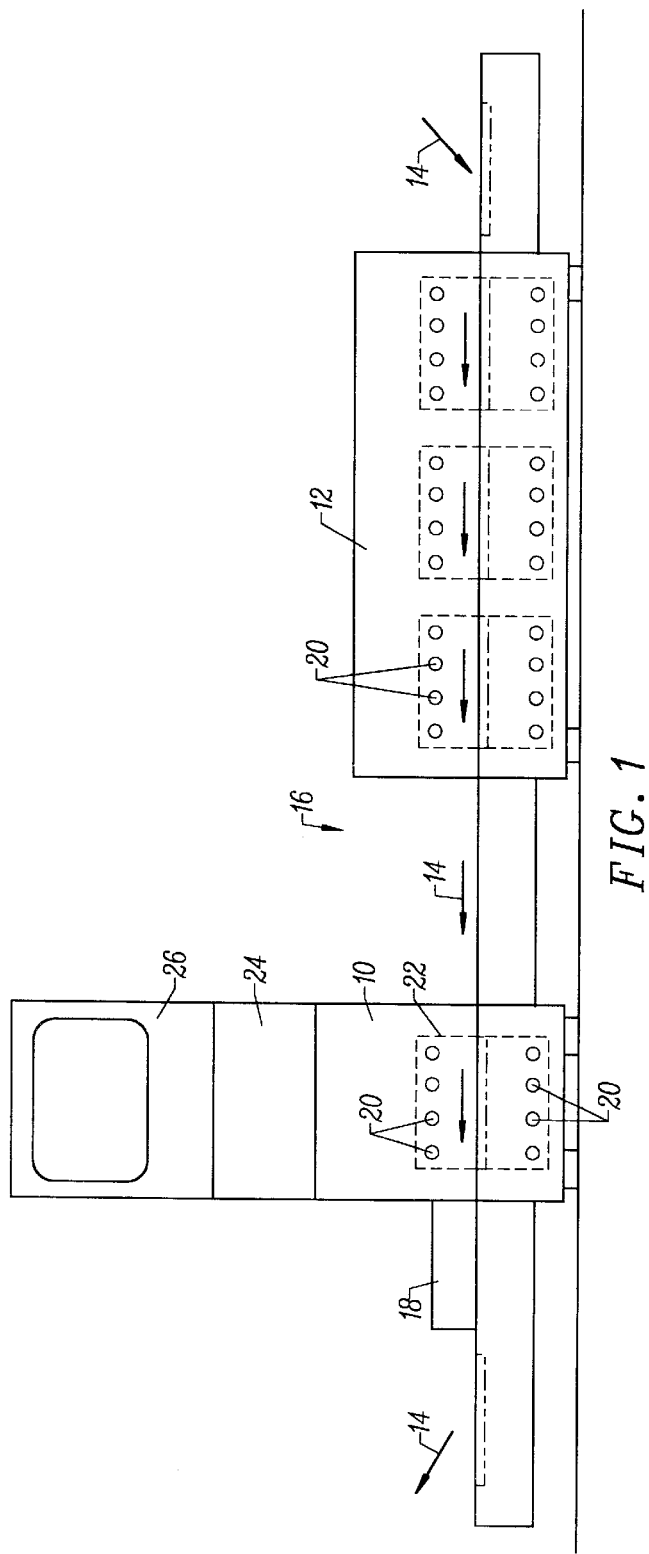
FIG. 1 is a side view of the entire installation.
Figure 2:
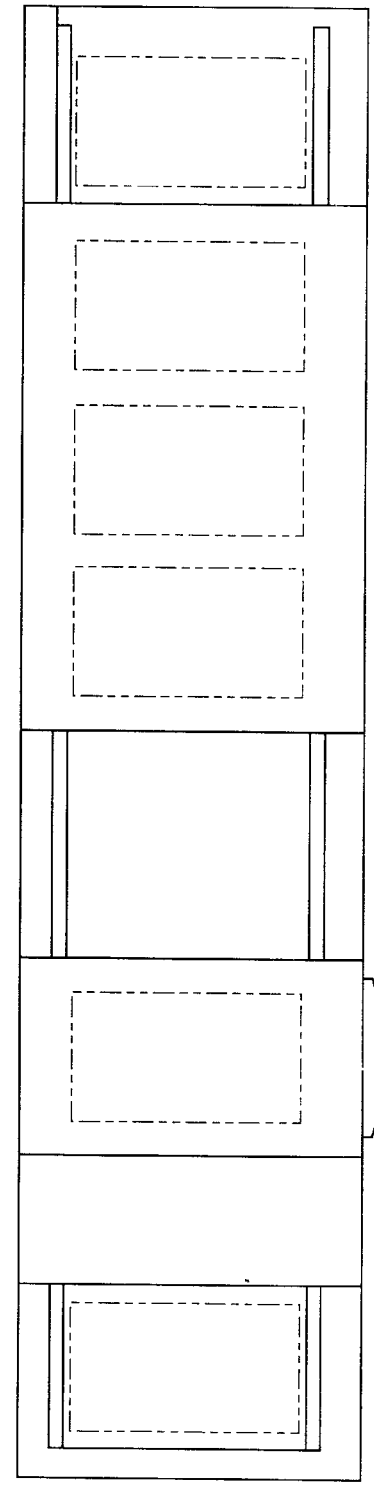
FIG. 2 is a plan view of the installation shown in FIG. 1.

The installation according to FIG. 1 comprises the end stage apparatus 10 and the preceding tunnel furnace 12 through which the device-carrying boards pass in a stepwise manner in direction of arrows 14. A transfer station 16, illustrated in open state, is provided between the two units which transfer station permits to insert device-carrying boards directly into the end stage apparatus with tunnel furnace 12 being switched off (or not being present); the control of the end stage apparatus is such that it performs either heating, beginning with the intermediate temperature level (produced by the tunnel furnace) until the solder melts or, alternatively, permits heating to proceed through all three temperature levels. Adjacent the exit side of end stage apparatus 10 there is a supplemental housing 18 the function of which will be later described.

In the drawings, radiation heaters 20 are indicated which preferably are medium wave infra-red radiators. Such radiators are available in commerce, have little thermal inertia and may be controlled e.g. via a phase clipping circuit in order to control the temperature. The design of such control does not cause any problems for an expert and does not form part of the present invention.

On top of the heating chamber 22 the end stage apparatus has an intermediate housing 24 housing the monitoring camera 25, and on top thereof a display screen monitor 26 is disposed.

Figure 3:
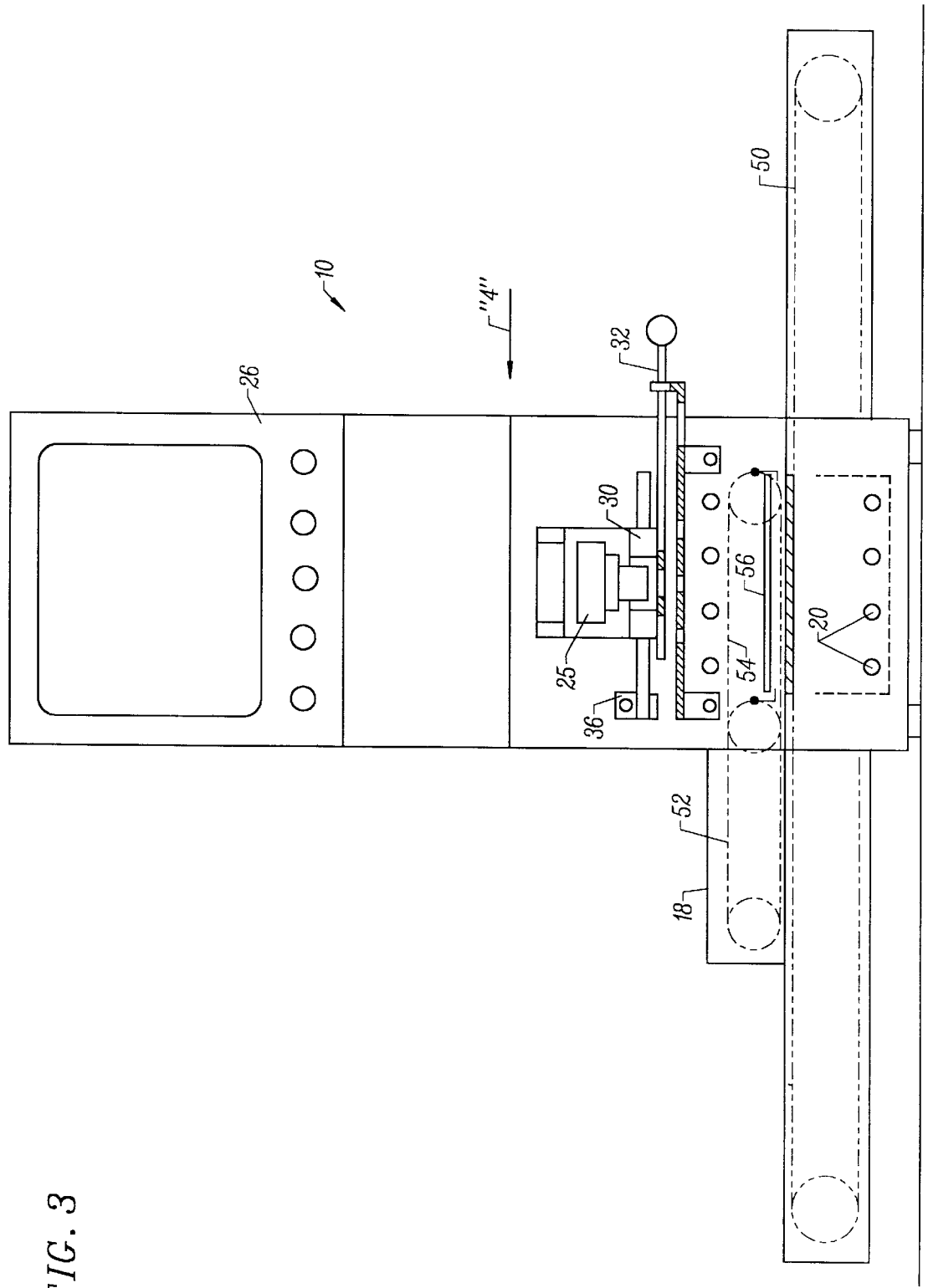
FIG. 3 illustrates in an enlarged scale the individual apparatus of the installation shown in FIG. 1 and 2.
Figure 4:
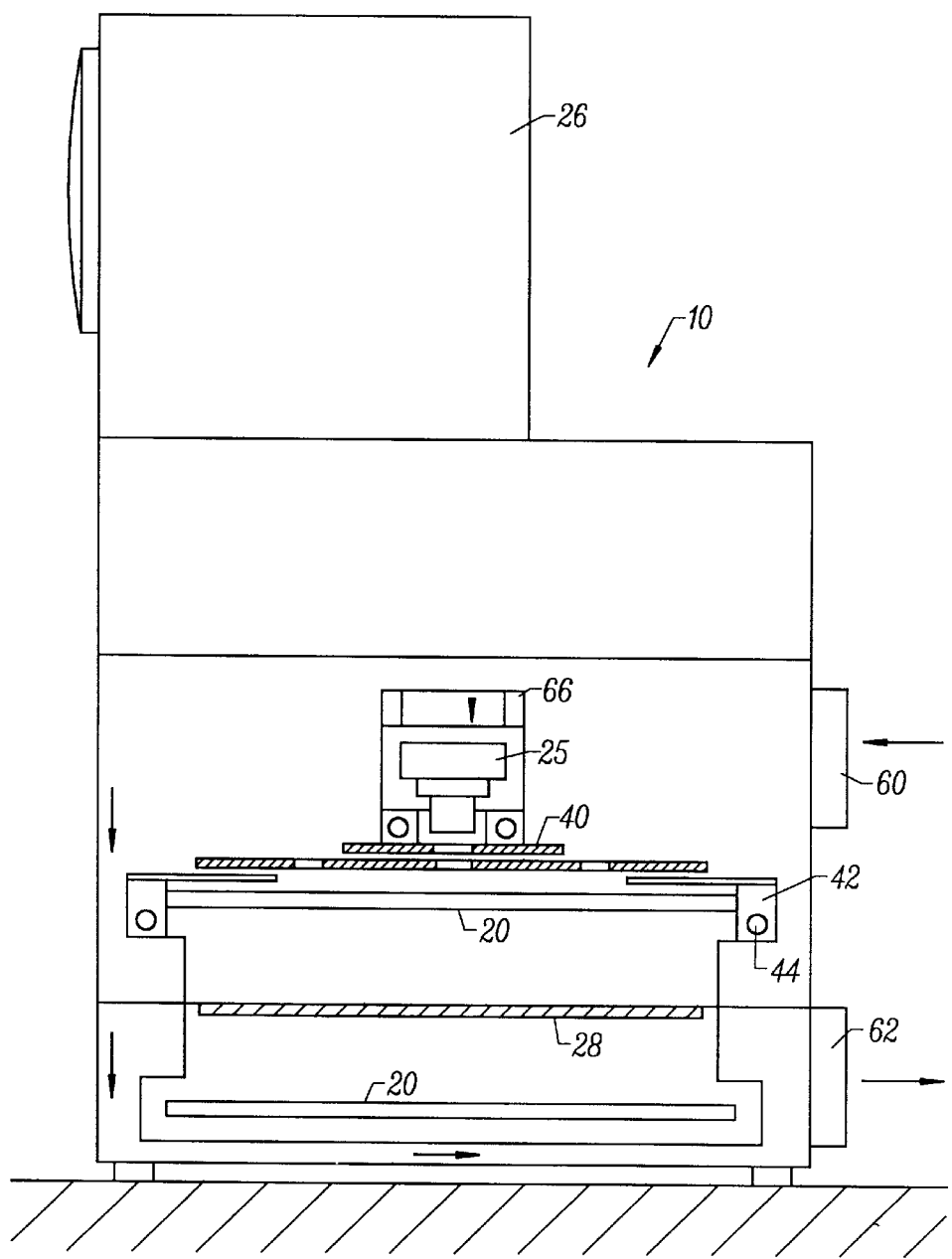
FIG. 4 is a side view seen in direction of arrow "4" in FIG. 3.
Figure 5:
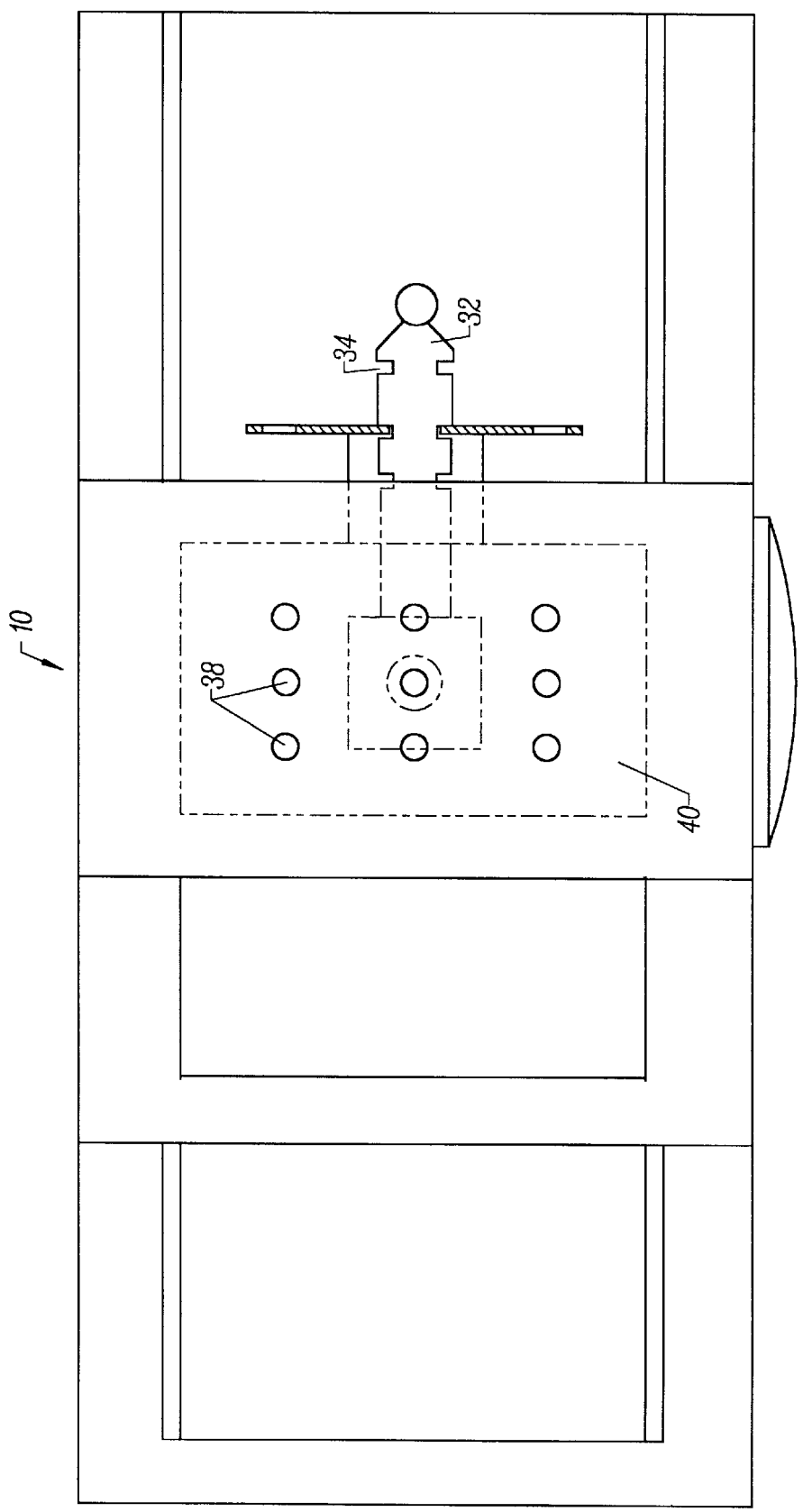
FIG. 5 illustrates the diaphragm device of the monitoring unit.

The design of the end stage apparatus 10 is shown in greater detail in FIGS. 3 to 5. The monitoring camera which may be a video camera available on the market for observation purposes or the like is directed vertically downward aiming at the board supported by a frame-like carrier 28 and transported by a chain conveyer. The output signal of the camera is supplied to monitor 26. The camera lens system is intentionally not focussed at the board surface, so that the image "seen" by it will appear in a misfocussed manner on the monitor; as such cameras normally have a brightness servosystem the monitor screen will at first display a substantially uniform grey surface. As soon as the solder melts, however, the solder droplets will reflect a substantial amount of visible light into the camera lens system, and an image similar to a shooting star will appear on the monitor screen. This is the signal for the operator to switch off the heaters and/or to transport the board out of the chamber 22 and to subject it to cooling by means of a blower.

It will be understood that the operator may be replaced with an image recognition system, or that the monitor is not required and instead the video output signals of the camera are directly processed.

As shown in the drawings, the camera must "look" between two juxtaposed radiators. Thus, it can recognize only a portion of the board if the full width of the apparatus is used. To permit observation of all board areas, camera 25 is mounted on a carriage 30 which, by means of a handle 32, is displaceable into three positions defined by notches 34. Carriage 30, in turn, is mounted on a slider 36 which is displaceable orthogonal with respect to the carriage movement by means of handle 32 between three stop positions. Each of the nine stop positions is associated with a sight opening 38 in a diaphragm 40. Finally, the assembly consisting of the upper radiators, their frame 42, diaphragm 40 and the camera with its notch system slidingly displaceable along rails 44, so that all points of the board may be brought into the sight field of the camera without aiming the camera directly at a radiator.

It will be understood that the camera could be mounted laterally, the images being projected into its lens system by means of mirrors which, if desired, are moveable. It will further be understood that the camera could be replaced with a row sensor combined with a rotating polygonal mirror or the like. Finally, it will be understood that the manual displacement of the camera may be facilitated by motor drives.

In FIG. 3 the conveyer chains 50 for the boards are indicated. Two additional pairs of chains 52, 54 extend through the supplemental housing 18 into the interior of the heating chamber. They may be reciprocatingly driven by a driving motor, not shown. A mask carrier 56 is suspended on these chain pairs, the mask carrier being displaceable from a position out of the heating chamber thereinto by means of the chain pairs and lowerable on a board in order to mask selected areas thereof against radiation from above over a predetermined time interval. This, of course, makes sense only during the soldering period because previously a uniform warm-up of all portions of a board is attempted. The mask, made of e.g. aluminum film, is simply cut for the respective board.

It will be understood that other mechanisms are conceivable for displacement of the mask carrier, such as linkages and the like.

The housings of the apparatus are preferably double-walled and compulsorily cooled by means of blower device 60 and suction device 62. The cooling air flow is indicated in FIG. 4 by arrows 64. The camera has its own cooling blower 66.

I claim:

1. A soldering apparatus for reflow soldering of SMD circuit boards, comprising:

a housing, a support for circuit boards disposed in said housing, a plurality of spacedly juxtaposed elongate radiation heaters disposed in said housing above said support, a video camera disposed in said housing above said heaters and aiming towards said support, said video camera producing signals representative of molten and non-molten solder, a video transport device for displacing said video camera relative to said heaters in a first direction parallel to said heaters, a heater transport device for displacing said heaters and said camera relative to said housing in a second direction perpendicular to said first direction, and a video signal processor which processes said signals, whereby said video camera may look through gaps between adjacent heaters regardless of its position relative to said housing.

2. The apparatus of claim 1 comprising a carriage supporting said video camera, said carriage being displaceable in said first direction, said carriage and said heaters forming an assembly displaceable in said second direction.

3. The apparatus of claim 1 wherein said video processor includes a video monitor.

4. A soldering apparatus for reflow soldering of SMD circuit boards comprising:

a housing, a support for circuit boards disposed in said housing, a plurality of spacedly juxtaposed elongate radiation heaters disposed in said housing above said support, a tunnel furnace disposed adjacent said housing, a transport device for transferring circuit boards from said tunnel furnace onto said support, whereby circuit boards are preheated in said tunnel furnace and after transfer unto said support solder is molten by radiation of said heaters.

5. A soldering apparatus for reflow soldering of SMD circuit boards, comprising:

a housing, a support for circuit boards disposed in said housing, a plurality of spacedly juxtaposed elongate radiation heaters disposed in said housing above said support, and a heat shield for temporarily shielding selected circuit board areas against radiation from said heaters.

* * * * *